United States Patent [19]
Redfield et al.

[11] Patent Number: 5,896,210
[45] Date of Patent: Apr. 20, 1999

[54] MOLDED BLOCK OPTICAL SYSTEM FOR VOLUME HOLOGRAPHIC STORAGE

[75] Inventors: Stephen R. Redfield; Jahja I. Trisnadi, both of Austin, Tex.

[73] Assignee: Tamarack Storage Devices, Los Alamos, N.M.

[21] Appl. No.: 08/337,161

[22] Filed: Nov. 9, 1994

[51] Int. Cl.$^6$ .............................. G03H 1/00; G03H 1/12; G02B 5/04; G11C 13/04
[52] U.S. Cl. .......................... 359/30; 359/11; 359/833; 359/384; 359/598; 365/125
[58] Field of Search ..................... 359/7, 9, 10, 11, 359/833, 834, 30, 32, 35, 542, 598, 850, 853; 369/103, 112; 365/125; 264/1.32, 1.33; 385/14

[56] References Cited

U.S. PATENT DOCUMENTS

| | | | |
|---|---|---|---|
| 3,990,771 | 11/1976 | Hundelshausen et al. | 359/25 |
| 4,120,569 | 10/1978 | Richards | 359/11 |
| 4,597,630 | 7/1986 | Brandstetter et al. | 359/9 |
| 5,235,439 | 8/1993 | Stoll | 359/7 |
| 5,436,867 | 7/1995 | Mok | 365/216 |

OTHER PUBLICATIONS

Steve Redfield and Lambertus Hesselink, "*Data Storage in Photorefractives Revisited*," SPIE vol. 963 Optical Computing 88 (1988), pp. 35–45.

Steve Redfield and Jerry Willenbring, "*Holostore Technology for Higher Levels of Memory Hierarchy*," Microelectronics and Computer Technology Corporation, (MCC), Austin, Texas, pp. 1–5, Rev. Jun. 11, 1991.

*Primary Examiner*—Cassandra Spyrou
*Assistant Examiner*—Audrey Chang
*Attorney, Agent, or Firm*—Gregory M. Howison

[57] ABSTRACT

Molded block optics system (10) writes and reads data from an optical storage medium and includes first molded optics block (12) for receiving reference beam (60) and original object beam (46) that contains a predetermined data set. First molded optics block (12) includes reflective surfaces (18, 20, 22, and 24) and spatial light modulator (50). Reflective surfaces (18, 20, and 24) include reference beam surfaces (24) and object beam surfaces (18, 20, and 22). Reference beam surfaces (24) direct reference beam (60) to optical storage medium (16) at predetermined location (54). Spatial light modulator (50) modulates object beam (46) and directs modulated object beam (46) to predetermined location (54). Reference beam (60) and object beam (46) form an interference pattern that writes data on optical storage medium (16). First molded optics block (12) also directs reference beam (60) to optical storage medium (16) for generating reconstructed object beam (64). Second molded optics block (14) receives reconstructed object beam (64), and includes reflective surfaces that direct reconstructed object beam (64) to detector array (32).

16 Claims, 7 Drawing Sheets

MOLDED BLOCK OPTICAL SYSTEM FOR VOLUME HOLOGRAPHIC STORAGE

TECHNICAL FIELD OF THE INVENTION

The present invention relates to data storage methods and systems and, more particularly, to a molded block optics construction for volume holographic storage that (1) uses molded blocks to create optical paths for reference and object light beams, (2) may very conveniently employ reflective optics, and (3) may employ phase encoding to multiplex recordings at a single recording site.

BACKGROUND OF THE INVENTION

A volume holographic storage device writes and reads data in an optical form. See, for example, S. Redfield and L. Hesselink, "Data Storage in Photorefractives Revisited," *Optical Computing 88*, Proc. SPIE, Vol. 963, Toulon, France, pp. 35–45 (1988), which reports investigations of a holographic data storage technology (hereinafter Redfield). The technology of Redfield encodes the information to be stored in an optical recording medium as a two-dimensional array of spots called a "page." The optical recording medium for a write/read subsystem may be a photorefractive crystal. Pages are stored as patterns in the distribution of donor electrons of the photorefractive crystal which locally affect the index of refraction of the material. The pages are actually stored as a hologram of the Fourier transform of the spot array. The Fourier transform is a convenient way to obtain a small recording size and provides some immunity to crystal material defects. Pages are placed in the photorefractive crystal as a two-dimensional array of stacks of pages.

By storing the pages in stacks and having an array of these stacks, a holographic storage system achieves three-dimensional use of the recording media. Another advantage of using pages of holographically stored information is that read access times may increase to be 100 to 1,000 times faster than those obtainable with magnetic or optical disks. This is because readout of information can be done by simply directing light beams. This may be done with no moving parts. Further, this accessing involves reading out images, instead of single bits serially as is the case with magnetic recording. The result is a significant improvement in bandwidth. The holographic storage technology leverages the imaging properties of light and the ability of light to be launched.

While holographic storage technology has been investigated in the past, its use has not been generally accepted. One significant reason has been the immature state of the art of related technologies such as two-dimensional spatial light modulators (SLMs) or page composers, laser devices, beam deflectors, optical recording materials, and detector arrays. While considerable advances in recent years in all of these components make volume holographic optical storage an attractive technology, as Redfield explains, a significant limitation still remains in this technology with regard to the size and complexity of the optical configuration necessary to holographically store a large amount of data in an optical storage medium.

The example of a holographic storage system that Redfield describes includes an object path along which light travels from a laser through a shutter and on to an X-Y deflector system and a beam splitter. From the beam splitter, the light first encounters a device called a flys eye which corresponds to an array of small lenses, one for each stack. Next, the light passes through a transform lens and SLM. The transform lens is placed immediately in front of the SLM. It focuses through the SLM onto the region in the optical storage medium, where a page is to be written, and forms the Fourier transform of the SLM pattern at that place in the holographic storage medium. The optical storage medium is mounted to a holder which has a thermoelectric cooler/heater at its base for heating and cooling the storage medium. On the output side of the crystal is an imaging lens which images the output pattern onto the detector array. The detector array then performs high speed optical-to-electrical conversion of the data. The internal sequencing of the Redfield device may be accomplished by a microprocessor which controls exposures, loads the SLM, deflects beams, sequences reads and writes, and shifts data off the detector array.

The configuration of Redfield requires a multitude of optics devices for creating the necessary interference pattern from the reference beam and object beam, the movement of any one of which could adversely affect the overall result. Moreover, the Redfield configuration requires an optical path that covers typically 14 optical diameters. This inherent complexity and the associated size requirements yield a number of limitations. For example, this system demands a long narrow form factor which does not conveniently fit in a computer chassis. In addition, each of the optical elements requires individual placement. This placement requirement makes high manufacturing costs for a such system unacceptably high. The configuration of Redfield also requires an additional beam deflector for the reference beam. This adds further to the expense of the device.

In Redfield, as is the case with other holographic recording configurations, the device holds the read/write media fixed while reference and object beams are positioned to angle multiplex pages at different stack sites in the medium. The reference beam and object beam are first moved to a stack site in tandem, then an angle is placed on the reference beam. This means there are a very large number of possible beam positions. This large number of possible beam positions makes reading and writing data extremely complex. These systems also possess a limited recording medium window, i.e., the area on the optical medium on which data may be recorded without moving the medium.

Consequently, there is a need for an improved holographic storage system that does not require long distance or large spaces to write and read holographic images.

There is a need for a holographic storage system that avoids the multitude of individual optical components of conventional holographic storage systems and is economical to manufacture.

There is a further need for a holographic storage system that has simplified beam positioning and that limits multiple page and multiple stack beam positioning to one dimension and/or the use of phase encoding to eliminate reference beam angle deflection.

There is yet a further need for a holographic recording system that permits the use of a common deflector for both the reference and object beams so as to further minimize the cost of system manufacture, operation, and repair.

SUMMARY OF THE INVENTION

The present invention, accordingly, provides a molded block optics system for writing and reading data to and from an optical storage medium that substantially reduces or overcomes limitations and disadvantages associated with known holographic recording devices and systems.

According to one aspect of the present invention, there is provided a molded block optics system for writing and reading data to and from an optical or optical storage medium that includes a first molded optics block for receiving a reference beam and an object beam. The reference and object beams are formed of coherent light which comes from a common source. The first molded optics block includes a plurality of first reflective surfaces and associates with a spatial light modulator. The plurality of first reflective surfaces includes reference beam surfaces and object beam surfaces. The reference beam surfaces direct the reference beam to a predetermined location of the optical storage medium. The object beam surfaces associate with the spatial light modulator for generating a modulated object beam that includes a predetermined data set and further for directing the modulated object beam to the same predetermined location of the optical storage medium at which the reference beam was directed. The reference beam and the modulated object beam form an interference pattern on the optical storage medium that writes the predetermined data set as a hologram.

The first molded optics block further associates with the optical storage medium for directing the reference beam to the optical storage medium. The reference beam, upon hitting the recorded interference pattern on the optical storage medium, generates a reconstructed object beam. The reconstructed object beam includes data that has previously been recorded on the optical storage medium.

A second molded optics block receives the reconstructed object beam. The second molded optics block includes a plurality of second reflective surfaces for receiving the reconstructed object beam and directing the reconstructed object beam to a detector array for detecting the data set in the reconstructed object beam.

A technical advantage of the present invention is that it uses two molded blocks to accomplish most of the optics of a holographic storage system. The blocks may be made from glass or plastic, for example, and may be solid or hollow. This greatly reduces the manufacturing costs of the holographic storage device over systems that require numerous individual optical components. For example, the present invention makes economical the manufacture of a complex multi-beam, high tolerance imaging system. The preferred embodiment not only reduces the number of separate optical elements, but also eliminates alignment tweaking for most of the optics. The present invention further provides the benefits of high shock tolerance and self-compensation for thermal expansion. The present embodiment further reduces alignment needs by mounting opto-electronic components directly onto the blocks.

Another significant technical advantage of the present invention is that it permits the use of reflective optical techniques. This reduces the volume that the optics device requires to approximately one half that required by conventional systems that use refractive optics.

Another technical advantage of the present invention is that it provides an optical design of a holographic storage system that may practically incorporate phase encoding of the holographic image within the molded optics system. The system of the present invention may employ phase encoding to make practical multiplexed recordings in a single recording site. This significantly reduces the complexity of the optical paths within the system. This design, therefore, yields a very compact system with a much simpler optical layout and with lower manufacturing costs than can be achieved by traditional angle encoding systems.

Yet a further technical advantage of the present invention is that it provides an optical design of a holographic storage system that may practically incorporate the sharing of a single deflector between two beams. At least one embodiment of the present invention uses the molded block design to further reduce the number of separately movable parts through the sharing of a single two-dimensional deflector for both the reference beam and the object beam.

Still another technical advantage of the present invention is that it permits movement of the optical storage medium in at least one direction. This makes possible one-dimensional positioning of the reference beam and object beam to different stack sites on the optical storage medium. Consequently, beam deflection mechanisms for use with the present embodiment are greatly simplified. Any stack site in a two-dimensional array of predetermined sites may then be reached by a combination of media and beam movement. At each one of these stack sites, numerous pages may be stored in and read from the optical storage medium. This increases significantly the accessibility of data from the optical storage medium.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF ILLUSTRATIVE EMBODIMENTS

The illustrative embodiments of the present invention are best understood by referring to the FIGUREs wherein like numerals are used for like and corresponding parts in the various components.

Holographic data storage in photorefractive materials uses recent advances in photoreflective materials such as strontium barium niobate (SBN) for holographic image recording, as well as advances in the technologies for acousto-optic deflectors, spatial light modulators, charged couple devices and lasers to yield low latency mass storage devices. The present embodiment builds on the work that is described in S. Redfield and L. Hesselink, "Data Storage in Photorefractives Revisited," *Optical Computing* 88, Proc. SPIE, Vol. 963, Toulon, France, p. 35 (1988), to provide a novel and highly attractive system for implementing the optical path of a holographic storage system. In addition, one embodiment provides an optical design that employs phase encoding, shares a single deflector between two beams, fits into a 5¼-inch personal computer disk drive form factor, and uses a large recording media window.

Figure 1:
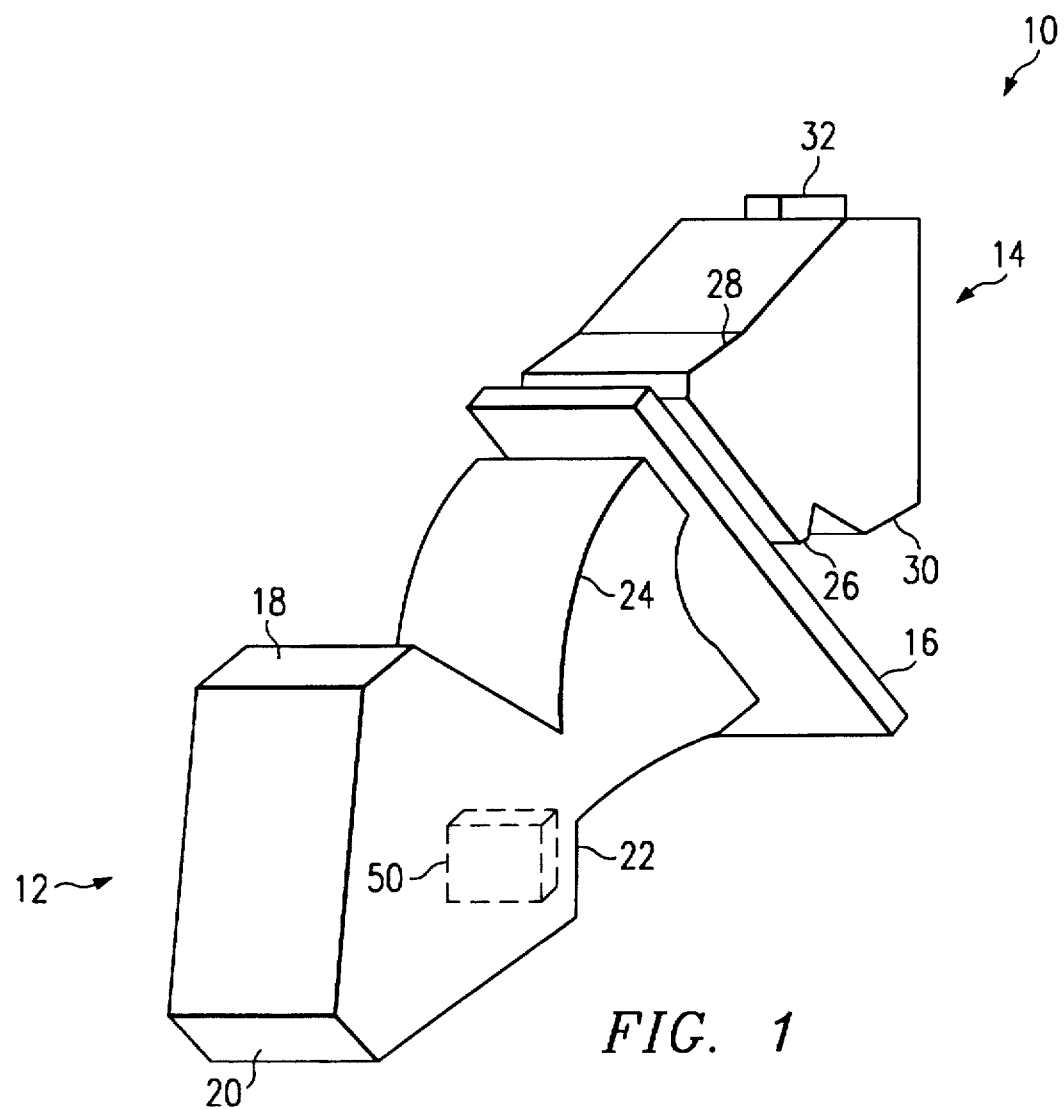
FIG. 1 provides an isometric view of a molded block optics system for optical storage medium writing and reading according to one embodiment of the present invention.

FIG. 1 shows one embodiment of the present invention as molded block optics system 10 that includes a first or front molded optics block 12 and a second or back molded optics block 14. Between front molded optics block 12 and back molded optics block 14 is optical or optical storage medium 16. Optical storage medium 16 is an optical storage material that the present embodiment uses to store a holographic image. The isometric view of front molded block optics system 12 shows the exterior portions that correspond to interior reflective surfaces for reflecting an object beam to optical storage medium 16. These surfaces include parabolic reflective surface 18 and parabolic reflective surface 20 that associate with an SLM 50 (shown in dash lines) which attaches to surface 22. In addition, front molded optics block 12 includes a cylindrical elliptical reflective surface 24 for transmitting a reference beam to optical storage medium 16. Parabolic reflective surface 18 and parabolic reflective surface 20 work in conjunction with SLM 50 to generate an object beam that goes to optical storage medium 16, while cylindrical elliptical reflective surface 24 directs a reference beam also to optical storage medium 16.

Back molded optics block 14 includes a plurality of interior reflective surfaces, such as reflective surface 26 for receiving a reconstructed object beam. Reflective surface 26 is a flat mirror that directs the reconstructed object beam to parabolic reflective surface 28 and further to parabolic reflective surface 30. While en route to parabolic reflective surface 30, the reconstructed object beam enlarges. Reflective surfaces 28 and 30, acting in conjunction with reflective surface 20, image the data from SLM 50 onto the detector array 32. From parabolic reflective surface 30, the reconstructed object beam further enlarges and goes to detector array 32. Detector array 32 reads data that the reconstructed object beam holds and supplies the information in the associated processing system.

Figure 2:
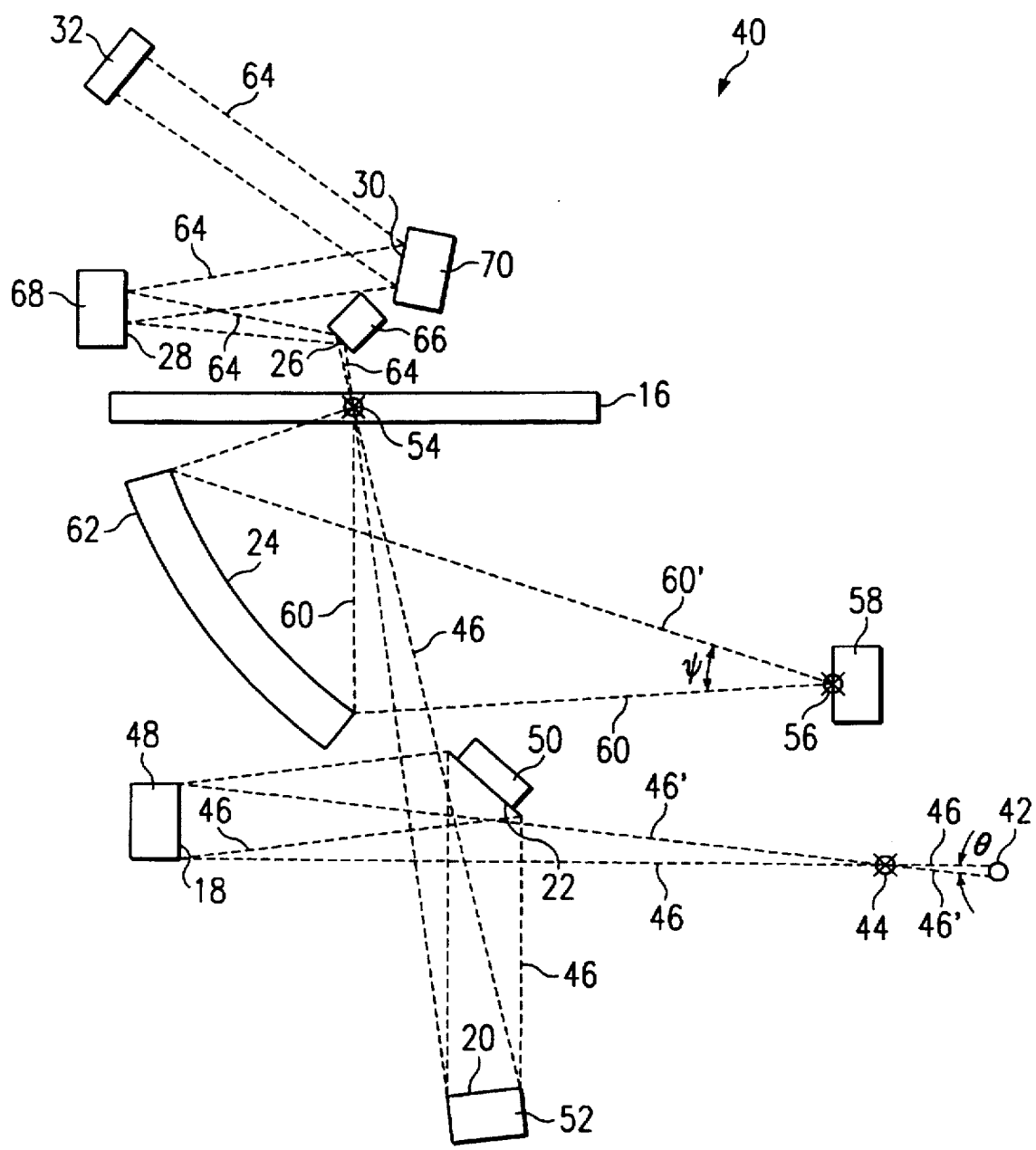
FIG. 2 provides a conceptual illustration of the folded optical paths that the present embodiment provides, including paths for a reference beam, an original object beam, and a reconstructed object beam.

The system of reflections, translations and modulation that molded block optics system 10 provides is further illustrated conceptually in FIG. 2, where each surface of molded block optics system 10 is represented by a discrete component. Referring to FIG. 2, there appears reflective system 40 that conceptually illustrates the processing of the reference and object beams to write and read data on optical storage medium 16. Beginning at ball array 42, light that came from a laser system and a vertical (up-down) deflection system (not shown) begins and passes to and through an expanding lens 44. The ball of ball array 42 from which the light will emerge depends on the state of the vertical deflection system. (See FIG. 4 and accompanying text, below.) Expanding lens 44 transmits object beam 46 to reflective surface 18. For ease in illustration, reflective surface 18 appears as the surface of parabolic mirror 48. Reflective surface 18 collimates expanded object beam 46. From parabolic mirror 48, object beam 46 travels to surface 22 that associates with SLM 50. SLM 50 imposes data signals on object beam 46. From SLM 50, object beam 46 travels to reflective surface 20, which is here shown as part of parabolic mirror 52. Reflective surface 20 focuses object beam 46 as the Fourier transform of the data signals on recording site 54 of optical storage medium 16. Predetermined recording site 54 relates to a stack of pages within optical storage medium 16.

Note that the object beam 46 may begin from any one of many vertically stacked balls of the ball array 42. The particular ball that object beam 46 begins from is determined by optics or reflective surfaces upstream of ball array 42 that change the position or angle of object beam 46. Each of these object beams, however, passes through focusing lens 44 for further transmission and focus propagation to the above-described reflective surfaces. The different paths that object beam 46 takes through front molded optics block 12 cause object beam 46 to reach optical storage medium 16 at one of many vertically arranged recording sites in the medium.

FIG. 2 shows propagation and orientation of the reference beam as beginning from a spot on mirror 56 that associates with stepper motor 58. Mirror 56 receives from the above-mentioned laser a reference beam and generates original deflected reference beam 60. Deflected reference beam 60' shows the extreme angle or position that reference beam 60 may take. That is, reference beam 60 and reference beam 60' are two separate reference beams, shown in FIG. 2 to illustrate the range of angles available with the present embodiment. The position of mirror 56, which stepper motor 58 controls, determines the angle of the reference beam which ranges from that of reference beam 60 and that of reference beam 60'.

Beginning at mirror 56, therefore, reference beam 60 travels to elliptical surface 24, which conceptual diagram 40 shows as elliptical mirror 62. From elliptical reflective surface 24, reference beam 60 travels to predetermined recording site 54 of optical storage medium 16. Upon reference beam 60 and object beam 46 reaching predetermined recording site 54, they interfere with one another to produce a holographic image. Optical storage medium 16 remembers or stores the holographic image as a hologram page in a stack of pages at predetermined recording site 54.

From optical storage medium 16, a reconstructed object beam 64 may be generated when reference beam 46 alone reaches a stored holographic image at predetermined location 54. This, for example, produces reconstructed object beam 64 that goes to reflective surface 26 of mirror 66. From reflective surface 26, reconstructed object beam 64 travels to reflective surface 28 of parabolic mirror 68. Reflective surface 28 directs reconstructed object beam 64 to reflective surface 30 of parabolic mirror 70. Reflective surface 30 further directs reconstructed object beam 64 to CCD array 32.

Figure 3:
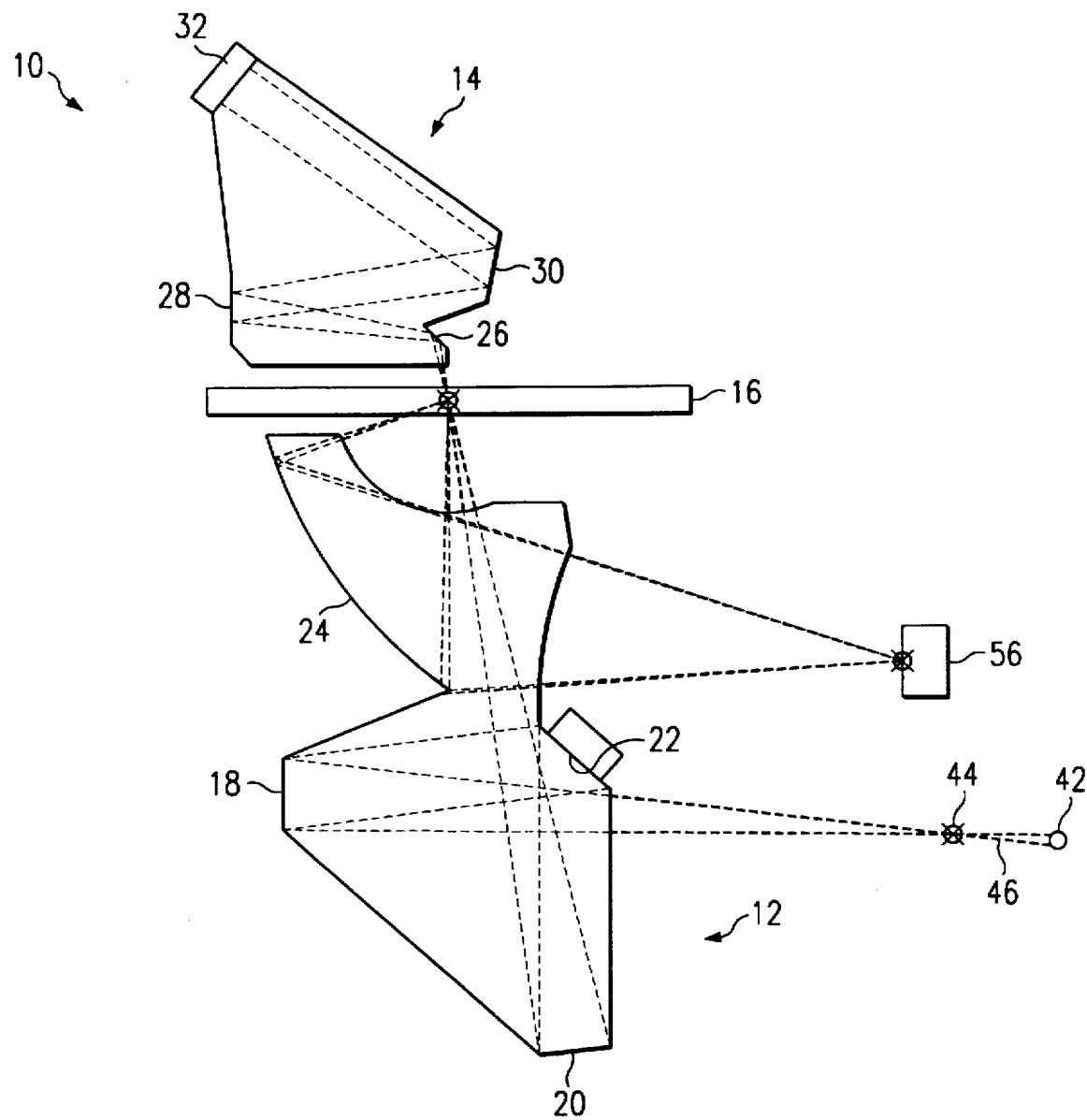
FIG. 3 illustrates more particularly the optical paths that occur in the present embodiment of the invention.

FIG. 3 illustrates how the present embodiment employs the concepts of the invention that FIG. 2 outlines by showing the beam paths through front molded optics block 12 and back molded optics block 14. These molded optics blocks correspond to those of the isometric views in FIG. 1. The ray path and surfaces for the molded block optics system 10 of FIG. 3 correspond to the descriptions of FIG. 2. Molded block optics system 10 of FIG. 3 uses the surfaces formed from shaping each of the molded optics blocks to have a shape corresponding to the construction of the mirrors that the reflective system 40 of FIG. 2 prescribes.

Figure 4:
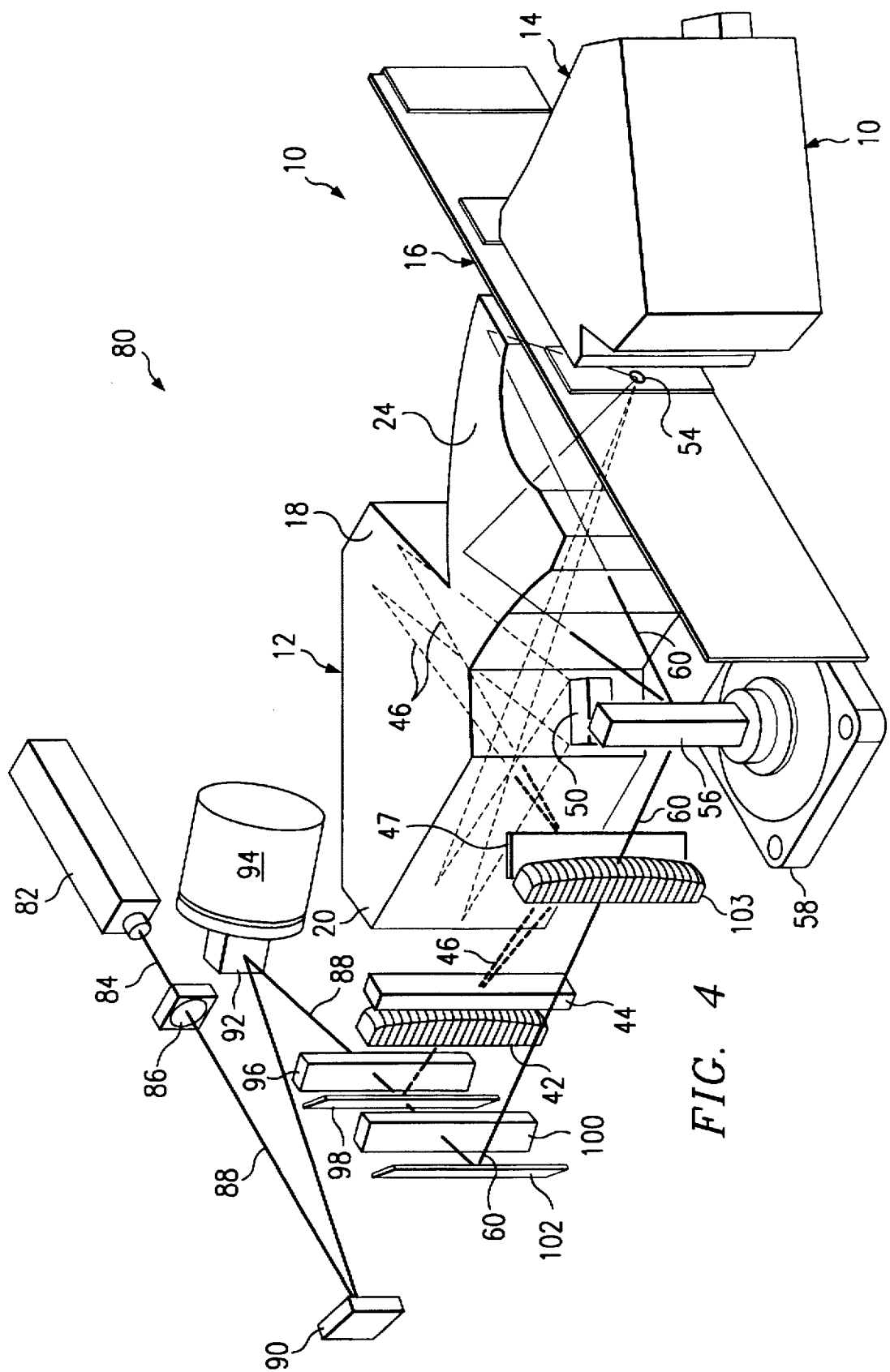
FIG. 4 illustrates an encasement configuration with stepper motor placement that affords operation of the present embodiment in a form factor similar to that of a conventional personal computer disk drive.

FIG. 4 shows an overall optical layout 80 for the present embodiment that includes molded block optics system 10, a laser system including laser 82, laser optics 86, and mirror 90, as well as a vertical (up-down) deflection system having Y deflector mirror 92, motor 94, and lens 96. This layout could be packaged within the form factor of a conventional personal computer 5¼-inch disk drive.

In the FIG. 4 example, overall optical layout 80 begins at laser 82 from which laser beam 84 travels to laser optics 86.

From laser optics 86 collimated laser beam 88 travels to mirror 90. Mirror 90 reflects beam 88 to Y deflector mirror 92. Motor 94 controls the position of Y deflector mirror 92 so that beam 88 travels to lens 96 via one of many angles. Lens 96 has Y deflector mirror 92 at its focal point so it levels laser beam 88. From lens 96, the laser beam takes one of many vertically stacked horizontal paths to beam splitter 98. From beam splitter 98, object beam 46 forms from beam 88 and travels through ball array 42 to focusing lens 44 and onward to mirror 47. Mirror 47 directs object beam 46 into front optics block 12 and onto parabolic reflective surface 18. From parabolic reflective surface 18, object beam 46 travels to SLM 50, then to parabolic reflective surface 20, and onto predetermined recording location 54 of optical storage medium 16 as described above in connection with FIGS. 2 and 3, above.

Reference beam 60 also forms when beam 88 passes through beam splitter 98 and then travels through lens 100 to reflective surface 102. Reference beam 60 then travels through lens 103 to flat mirror 56. Lens 100 and 103 form a telescope which inverts the reference beam deflection so it tracks the object beam. Stepper motor 58 controls the position of mirror 56 and directs reference beam 60 to cylindrical elliptical surface 24. Reference beam 60 then travels to predetermined location 54 of optical storage medium 16. Through the operation of stepper motor 94 and stepper motor 58, optical layout 80 positions object beam 46 and reference beam 60 to one of many possible vertically-arranged predetermined locations 54 of optical storage medium 16 for recording an optical data pattern of holographic images.

The compact system of optical layout 80 depicts a molded block optics system 10 that fits comfortably within a disk drive chassis which may take the form factor of a 5¼-inch disk drive for a desk top or personal computer. Note also that the form factor of optical layout 80 may also permit a cartridge which could hold numerous holographic storage media 16 to be within the chassis for permitting placement of numerous different optical storage media 16 between front molded optics block 12 and back molded optics block 14.

Figure 5:
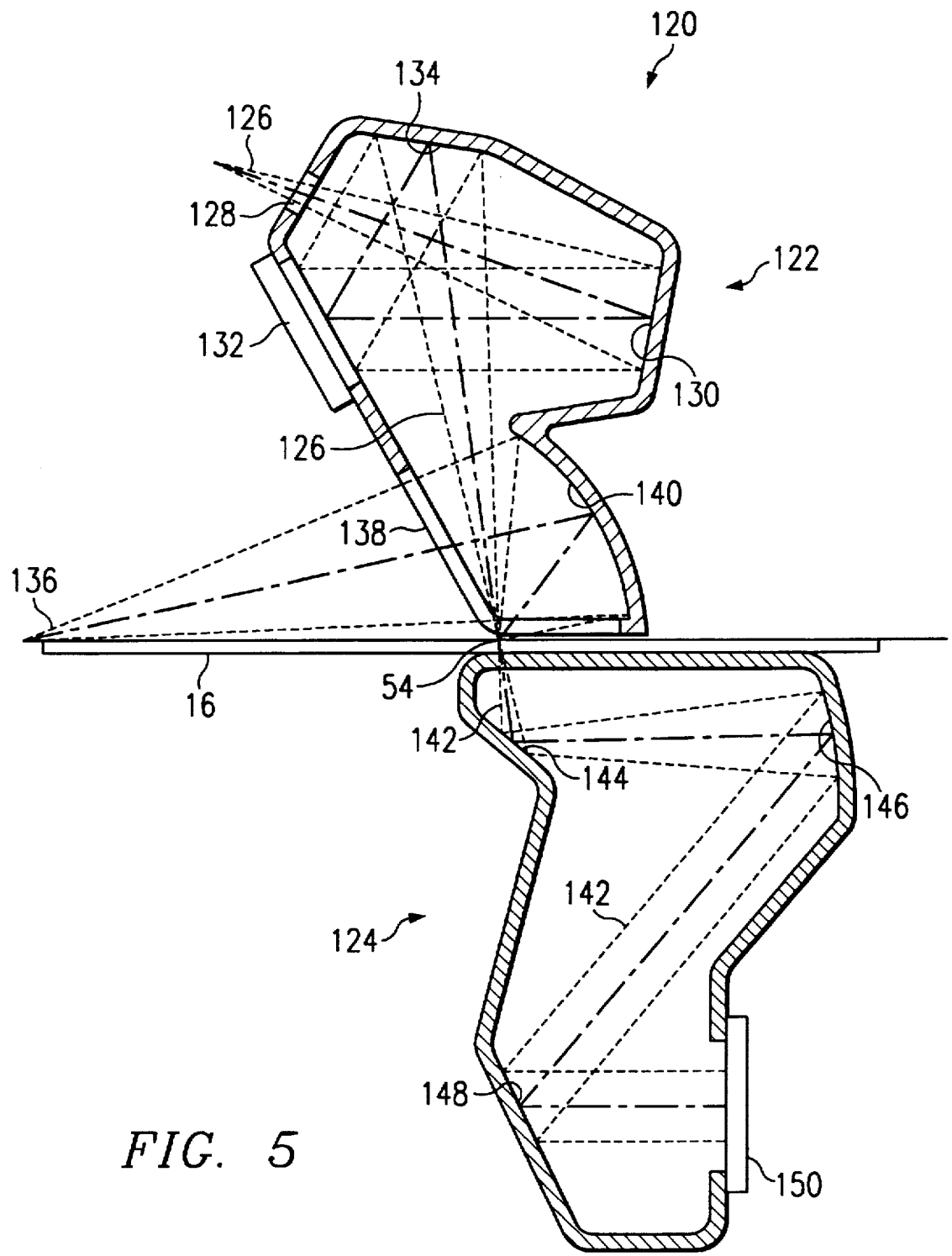
FIG. 5 shows an alternative embodiment of the present invention that provides hollow reflective blocks for the reference and object beams.

FIG. 5 illustrates an alternative embodiment of the present invention in which molded block optics system 120 includes front molded optics block 122 and back molded optics block 124. A distinction between molded block optics system 10 of FIGS. 1–4 and molded block optics system 120 of FIG. 5 is that molded block optics system 120 is hollow and forms reflective surfaces from the interior side walls of the respective portions of system 120. Molded block optics system 120 of FIG. 5, therefore, possesses the technical advantage of further weight savings due to its hollow internal volume that is distinct from molded block optics system 10 of FIGS. 1–4. Molded block optics system 120 further possesses the technical advantage that the light beams pass through air. This eliminates or substantially reduces problems of solid blocks that arise from scattering and birefringence.

In FIG. 5, object beam 126 enters front or first molded optics block 122 through opening 128 and goes to reflective surface 130. Object beam 126 then reflects to reflective spatial light modulator 132, which imposes a data pattern on object beam 126. From spatial light modulator 132, object beam 126 goes to a reflective surface 134. Reflective surface 134 focuses object beam 126 to form the Fourier transform and directs focused object beam 126 to predetermined recording site 54 of optical storage medium 16. Reference beam 136 enters front molded optics block 122 through opening 138 traveling at one of many angles. Although not shown in FIG. 5, this may be done by reference beam 136 reflecting from a mirror, such as mirror 56, that a stepper motor, such as stepper motor 58 (see FIG. 4), positions in one of many angles to enter front molded optics block 122 through opening 138. Reference beam 136 reflects then from reflective surface 140 to predetermined recording site 54 of optical storage medium 16 to arrive at predetermined recording site 54. The angles that reference beam 136 may assume correspond to a different page in the stack of pages to be recorded at this predetermined recording site 54.

In the event that a reconstructed object beam 142 is produced from optical storage medium 16, it passes to and reflects from flat reflective surface 144. From flat reflective surface 144, the reconstructed object beam 142 reflects to reflective surface 146. Reflective surface 146 directs the reconstructed object beam 142 further to reflective surface 148 which further reflects the reconstructed object beam 142 so that detector array 150 may detect and process reconstructed object beam 142 converting it into digital, electrical form and making it available for further processing. In the present embodiment, reflective surfaces 146 and 148 have optical power so that they correctly image the reconstructed object beam 142 onto detector array 150.

Figure 6:
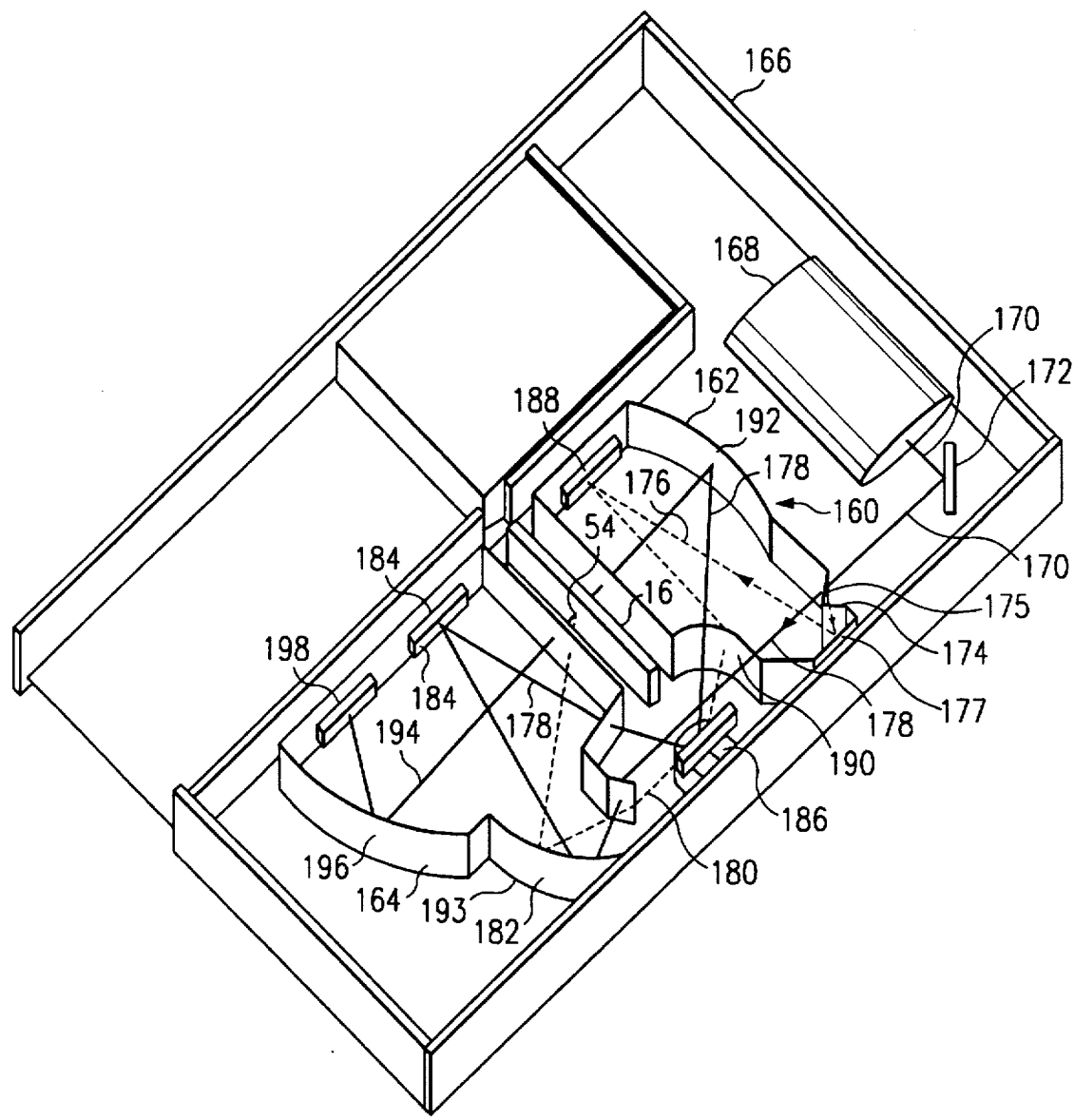
FIG. 6 illustrates a phase multiplexing embodiment of the present invention that allows for phase encoding of the data in the optical storage medium and a shared deflector which the object and the reference beams simultaneously use.

FIG. 6 displays important aspects of at least one embodiment of the present invention, which are the abilities to phase encode the holographic image and share a deflector between two beams, together with the use of molded block optics. FIG. 6 shows one embodiment of a molded block optics system 160 that includes the first molded optics block 162 and a second molded optics block 164. Molded block optics system 160 of FIG. 6 fits within form factor 166. This may be, for example, similar to the form factor that may accommodate optical layout 80 of FIG. 4.

In FIG. 6, molded block optics system 160 associates with laser 168 that produces laser beam 170. Mirror 172 directs laser beam 170 to beam splitter 175. Beam splitter 175 splits laser beam 170 into reference beam 176 and object beam 178. First molded optics block 162 sends object beam 178 to SLM expander 180 of second molded optics block 164. SLM collimator 182 then receives object beam 178, collimates, and reflects it to SLM 184. SLM 184 modulates object beam 178 and further directs it to X-Y deflector 186.

From beam splitter 175, reference beam 176 goes to corrugator expander 174. Corrugator collimator 177 then receives reference beam 176, collimates, and reflects it to phase corrugator 188. Phase corrugator 188 corrugates reference beam 176 and directs it also to X-Y deflector 186. From X-Y deflector 186, object beam 178 goes to transform surface 192. Transform surface 192 focuses and reflects object beam 178 to predetermined recording location 54 of optical storage medium 16. Also from X-Y deflector 186, reference beam 176 travels to corrugation director 193. Corrugation director 193 then reflects reference beam 176 to predetermined location 54 of optical storage medium 16.

When an object beam is reconstructed during readout, the reconstructed object beam 194 travels to image surface 196. Image surface 196 reflects reconstructed object beam 194 and sends it onward to detector array 198 which may be, for example, a charge coupled device (CCD) array.

Figure 7:
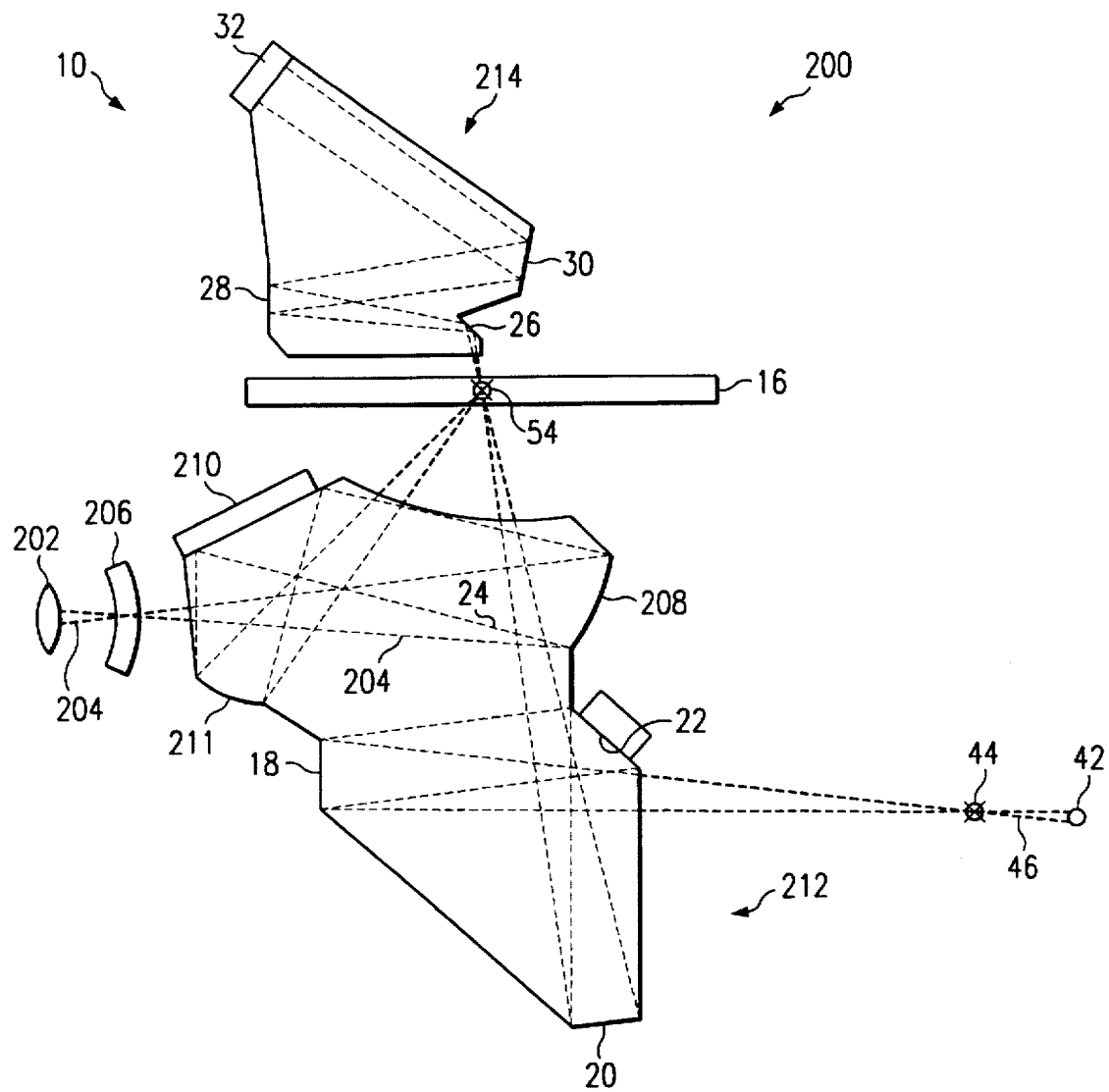
FIG. 7 illustrates a further alternative embodiment of the present invention that uses phase encoding for reading and writing data.

In FIG. 7 appears an alternative embodiment of the present invention in the form of phase encoding molded block optics system 200. Phase encoding molded block optics system 200 includes front molded optics block 212 and back molded optics block 214. The operation of phase encoding molded block optics system 200 is similar to that of the embodiment of FIGS. 1 through 4, however, instead of angle encoding pages at predetermined recording site 54 of optical storage medium 16, phase encoding molded block optics system 200 phase encodes the data patterns. The paths for object beam 46 and reconstructed object beam 64 paths are then identical to those of the FIG. 3 embodiment, for example. Note, however, the different path for reference beam 204. Reference beam 204, for purposes of discussion, may be considered to begin at lens 202 which expands the reference beam to fill phase corrugator 210. Reference beam 204 then travels to parabolic surface 208, which collimates and directs reference beam 204 to phase corrugator 210. Phase corrugator 210 places a relative phase pattern on reference beam 204 and directs it to parabolic surface 211. This phase pattern is one of a set of possible orthogonal phase patterns. Walsh codes are an example of such an orthogonal set. Parabolic surface 211 focuses reference beam 204 to predetermined recording location 54 of optical storage medium 16. Phase encoding front optics block 212 modulates object beam 46 in a manner essentially identical to that of front molded optics block 12 of FIG. 3. Also, phase encoding back molded optics block 214 operates essentially similar to back molded optics block 14 of FIG. 3 above. Thus, FIG. 7 shows that the present invention practically and straight forwardly incorporates phase encoding in a molded block optics system 200 within the scope of the present invention.

OPERATION

Having described the components and their association, the following discussion details operation of the above illustrative embodiments for data writing to and reading data from optical storage medium 16. For example, a personal computer may include in its 5¼-inch disk drive slot a holographic storage system 10 that incorporates one of the above embodiments. If a user desires to write data to optical storage medium 16, the user may insert a diskette cartridge containing optical storage medium 16 into holographic storage system 10. The user may then direct holographic storage device 10 to remove optical storage medium 16 from the cartridge and position the medium between front molded optics block 12 and back molded optics block 14. Holographic storage system 10 may, therefore, include a mechanism for performing this type of optical storage medium positioning.

Once optical storage medium 16 is in the desired position, and with reference to FIGS. 1 through 4, laser 82 supplies coherent beam 88 to front molded optics block 12 by first directing the laser beam 89 through beam conditioning optics 86 to produce laser beam 88. Laser beam 88 strikes Y deflector mirror 92 that stack stepper motor 94 controls. Y deflector mirror 92 deflects laser beam 88 up or down to one of a number of angles. Each angle corresponds to a different stack site in an up/down line on the medium. Next, leveling lens 96, which is positioned one focal length away from Y deflector mirror 92, levels deflected laser beam 88. Laser beam 88 is now traveling one of a number of vertically stacked horizontal paths, each horizontal path corresponding to a different recording site on the medium. Beam splitter 98 then splits laser beam 88 into reference beam 46 and object beam 60. The ball of linear ball array 42 that receives object beam 46 expands object beam 60 to address a desired stack on optical storage medium 16. Expanded object beam 46 then reflects internally within front molded optics block 12 to off-axis parabolic collimating surface 18 which collimates object beam 46. The resulting collimated object beam 46 then reflects from the reflective surface of SLM 50. SLM 50 imposes on object beam 46 the data pattern to be recorded at predetermined location 54. Object beam 46 then strikes a second, inversely-oriented off-axis parabolic transform surface 20. Parabolic transform surface 20 cancels the astigmatism of first parabolic surface 18. Parabolic transform surface 20, focuses the modulated object beam 46 to form the Fourier transform of the imposed data pattern at the recording point of predetermined location 54 on optical storage medium 16.

Traveling from beam splitter 98 along one of a number of possible horizontal paths, reference beam 60 goes to stepper motor 58. Each possible horizontal path corresponds to a different recording or stack site on optical storage medium 16. Page stepper mirror 56 directs reference beam 60 into front molded optics block 12 at one of a number of angles. Each angle corresponds to a different page that is angle multiplexed at the recording site 54. Reference beam 60 reflects internally from cylindrical elliptical surface 24. Cylindrical elliptical surface 24 is such that one of its foci is at page stepper mirror 56 and the other is at predetermined location 54 of optical storage medium 12. Page stepper mirror 56 and cylindrical elliptical surface 24 work together to direct reference beam 60 to strike the appropriate stack site on optical storage medium 16 at one of a range of predetermined angles. Each of these angles corresponds to a different multiplexed page in a stack. Optical storage medium 16 may be moved to the right or left, for example, to position a specific stack column at a desired position within the recording medium window.

Once focused object beam 46 and reference beam 60 both reach optical storage medium 16 at predetermined location 54 and the selected angle, they interfere with one another to form an interference pattern or hologram. This interference pattern, in the present embodiment, is called a "page." Optical storage medium 16 records the page at the selected angle and predetermined location 54 when using angle encoding. Note that instead of using mirror 56 and associated stepper motor 58, the phase encoding embodiment 200 of FIG. 7 may use phase encoding to write data to or read data from each predetermined location 54 of optical storage medium 16.

Once a hologram is recorded in optical storage medium 16, it may be read out at a later time. For example, the user may desire to remove the cassette for optical storage medium 16 from the system. On the other hand, the user may command the system via a user interface to the personal computer to permit reading the data from optical storage medium 16.

To read out a particular page recording, Y deflector mirror 92 is positioned for the appropriate vertical stack position of optical storage medium 16 that a predetermined location 54 may assume. When reading a page from optical storage medium 16, object beam 46 is blocked. Page stepper motor 58 positions mirror 56 so that reference beam 60 assumes the appropriate page angle in the angle encoding embodiment. Alternatively, phase encoder 210 in the phase encoding embodiment may change the reference beam 209 phase pattern or code to that of the desired phase code for the page to be read. Optical storage medium 16 is then moved to permit access to the desired stack column position. Note that the sequence of selecting the desired angle or phase and then the desired stack column position may be reversed, depending on various considerations.

In reading the page, reference beam 60 is pulsed. The original object beam that corresponds to the image or page recorded at the corresponded page angle is then reconstructed from the associated interference pattern or hologram in optical storage medium 16. This reconstructed object beam enters back molded optics block 14 and is reflected internally from reflective surface 26 to off-access parabolic surface 28. From off-access parabolic surface 28, the image strikes inversely oriented off-access parabolic surface 30. These two surfaces image reconstruct object beam 64 as a reconstructed page on detector array 32 which receives the page and converts it into signals for further processing.

In the embodiment of FIG. 5 the operation is essentially the same as that for FIG. 1 through 4 where the corresponding optical surfaces are accomplished by reflecting off internal surfaces of the molded blocks 122 and 124.

In the embodiment of FIG. 6, computer operations that the user performs are essentially the same as those to operate the holographic storage system 10 of FIG. 1 through 4. The operation of the FIG. 6 embodiment, however, is somewhat different. For example, whereas the embodiment of FIGS. 1 through 4 transmissively produces the reconstructed object beam, the FIG. 6 embodiment reflectively produces the reconstructed object beam. The following discussion, therefore, describes the operation of the FIG. 6 embodiment for writing to and reading from holographic storage medium 16.

The design of molded block optics system 160 includes an object beam 178 that interferes with reference beam 176. An interference pattern, or hologram, results from this interference that is recorded at predetermined location 54 of holographic storage medium 16. In the FIG. 6 embodiment, the object and reference beams are positioned to get to different stacks. The information pattern imposed on the object beam is called a page. Phase multiplexing is used to superimpose the holograms for a number of different pages in one stack site. To retrieve a page, reference beam 176, with a phase code corresponding to the desired page at predetermined location 54, is supplied which reconstructs the hologram. This reconstructed recording of a page is captured by detector array 198 which may be a CCD array.

The FIG. 6 embodiment provides coherent beam 170 from laser 168. Coherent beam 170 divides at beam splitter 174 into reference beam 176 and object beam 178. Reference beam 178 strikes phase corrugator 188 after first being expanded to fill corrugator 188. Reference beam 176 may be considered comprised of n portions (where n equals the number of multiplexed pages in a stack). Phase corrugator 188 retards the phase of selected portions by the angle π. These portions are different in an orthogonal manner relative to reconstruction for each different page. After corrugator 188 corrugates reference beam 176, the resulting corrugated reference beam 176 strikes two-dimension X-Y deflector mirror 186. X-Y deflector mirror 186 is moved so that reference beam 176 strikes the correct stack site at predetermined location 54. Object beam 178 strikes a reflective SLM 184 after first being expanded to fill SLM 184 and colluminated by the reflective SLM colluminator 182. After SLM 184, object beam 178 strikes the same X-Y deflection mirror 186. This mirror, therefore, is shared by both reference beam 176 and object beam 178. The optics of holographic storage system 160 are constructed so that positioning one of the beams to a given stack also positions the other to the same site. After reflecting from X-Y deflector 186, object beam 178 expands across reflective transforming surface 192 and is focused to stack site by this surface on predetermined location 54. All surfaces in molded block optics system 160 are realized by transparent molded blocks 162 and 164. For ease of use, corrugator 188, SLM 194, and detector array 198 may be pasted onto the sides of these respective blocks as indicated in FIG. 6.

In the embodiment of FIG. 7, the operation is somewhat different from that of FIGS. 1 through 4. The object beam path and reconstructed object beam path operation is essentially the same. The reference beam path operation is different in that it is phase encoded, rather than being positioned at different angles. The following discussion, therefore, describes the operation of FIG. 7 embodiment for writing to and reading from optical storage medium 16.

The design of molded block optics system 200 includes an object beam 46 that interferes with reference beam 204. An interference pattern, or hologram, results from this interference that is recorded at predetermined location 54 of optical storage medium 16. In the FIG. 7 embodiment, the object and reference beams are positioned to get to different stacks. Phase multiplexing is used to superimpose the holograms for a number of different pages in one stack site. To retrieve a page, reference beam 204, with a phase code corresponding to the desired page at predetermined location 54, is supplied which reconstructs the hologram. This reconstructed recording of a page is captured by detector array 32 which may be a CCD array.

The FIG. 7 embodiment provides reference beam 204 from lens 202. Reference beam 204 goes into front molded optics block 212 and reflects onto parabolic surface 208. Reference beam 204 then strikes phase encoder 210. Reference beam 204 may be considered comprised of n portions (where n equals the number of multiplexed pages in a stack). Phase encoder 210 retards the phase of selected portions by the angle π. These portions are different in an orthogonal manner relative to reconstruction for each different page. Each portion of the phase code is focused by parabolic surface 211 onto the desired stack site of predetermined location 54 on optical storage medium 16. This results in each portion of the phase coded reference beam 204 overlapping all other portions, even in a thin medium.

After phase encoder 210 encodes reference beam 204, the resulting encoded reference beam 176 strikes parabolic surface 211. As stated above, parabolic surface 211 then focuses reference beam 204 to the correct stack site at predetermined location 54. Object beam 46 strikes SLM 50 on surface 22 after first reflecting from parabolic surface 18. After being encoded by SLM 50, object beam 46 strikes parabolic surface 20. As stated earlier, parabolic surface 20 focuses the Fourier transform of object beam 46 at the desired predetermined location 54.

In reading a phase-encoded page from a predetermined location 54 on optical storage medium 16, object beam 46 is blocked. Reference beam 204 is phase encoded corresponding to the desired page in the stack at predetermined location 54. The correctly phase encoded reference beam 204 strikes the predetermined location 54 and forms a reconstructed object beam 64 that back molded optics block 214 sends to detector 32. Other operations of phase encoding molded block optics system 200 of FIG. 7 are similar to those of the angle encoding embodiment of FIG. 3.

ALTERNATIVE EMBODIMENTS

There are any number of alternatives or changes in the design of holographic storage system including molded block optics of the present invention which may be readily apparent to one ordinary skill in the art. Such alternatives may not be employed in the device of the above-illustrated embodiments for any number of reasons, such as cost and performance considerations, size constraints, availability of materials, arbitrary design decision, and the like. A number of these alternatives have been mentioned and described above. There are even further alternatives to forming embodiments of present invention. Such configurations and embodiments are well within the scope of the present invention. Thus, the invention is intended to be limited by the claims which are meant to cover such obvious alternatives and deviations from the above-illustrated and preferred designs.

What is claimed is:

1. A molded optics system for an optical storage system, comprising:

a first molded optics device for receiving a reference beam of light and an object beam of light;

said first molded optics device comprising a plurality of first reflective surfaces integral to said first molded optics device and associating with a data imposing device, said plurality of first reflective surfaces comprising reference beam surfaces and object beam surfaces, said reference beam surfaces associated to direct said reference beam to an optical storage medium at a predetermined location, said object beam surfaces associated with said data imposing device for placing data signals onto said object beam for forming an encoded object beam and directing said encoded object beam to said predetermined location of said optical storage medium, said object beam surfaces including a first parabolic reflective surface and a second parabolic reflective surface that works in conjunction with the first parabolic surface and the data imposing device and said reference beam surfaces comprising cylindrical elliptical reflective surfaces, said reference beam and said encoded object beam associated to form an interference pattern on said optical storage medium which records the data signals at said predetermined location.

2. The system of claim 1, wherein said first molded optics device further associates with said optical storage medium for directing said reference beam to the optical storage medium for generating a reconstructed object beam comprising said data signals from said optical storage medium.

3. The system of claim 1, further comprising a second molded optics device for receiving said reconstructed object beam and comprising a plurality of second reflective surfaces integral to said second molded optics device for directing said reconstructed object beam to a detector device.

4. The system of claim 3 wherein said plurality of second reflective surfaces of said second molded optics device comprise a second plurality of object beam surfaces and reference beam surfaces, said second plurality of object beam surfaces further comprising:

a reflective surface of said second molded optics device; and a first parabolic reflective surface of said second molded optics device; and a second parabolic reflective surface of said second molded optics device parabolic reflective surface that works in conjunction with the first reflective surface of said second molded optics device and the first parabolic reflective surface of said second molded optics device for securing and directing the reconstructed object beam from said optical storage medium to a detector.

5. The system of claim 1, further comprising a deflector mechanism for deflecting said reference beam and said object beam to travel through said molded optics storage system along a plurality of parallel paths, said plurality of parallel paths corresponding to storage locations of said data patterns in said optical storage medium.

6. The system of claim 1, wherein said data imposing device comprises a spatial light modulator and said first molded optics device is formed from a solid material and comprises a hollow cavity for receiving said reference beam and said object beam.

7. The system of claim 1, further comprising an angle encoding mechanism for encoding said reference beam with a predetermined angle, said predetermined angle associated with a particular superimposed data pattern recording in a collection of superimposed recordings in said optical storage medium.

8. The system of claim 1, further comprising a phase encoding mechanism for encoding said reference beam with a predetermined phase pattern, said predetermined phase pattern associated with a particular superimposed data pattern recording in a collection of superimposed recordings in said optical storage medium.

9. A method for storing information in an optical storage medium, comprising the steps of:

receiving a reference beam of light and an object beam of light in a first molded optics device;

forming a plurality of first reflective surfaces integral to the first molded optics device, the reflective surfaces including a first set of object beam surfaces having a first parabolic reflective surface and a second parabolic reflective surface that works in conjunction with the first parabolic surface;

forming a first set of reference beam surfaces including a cylindrical elliptical reflective surface;

directing said reference beam to the optical storage medium at a predetermined location using said plurality of first reflective surfaces formed integral to said first molded optics device;

writing data signals onto said object beam for generating an encoded object beam using a data imposing device associated with said first molded optics device and working in conjunction with the second parabolic reflective surface;

directing said encoded object beam to said predetermined location of said optical storage medium;

forming an interference pattern for recording said written data signals on said optical storage medium at said predetermined location using said reference beam and said encoded object beam.

10. The method of claim 9, further comprising the step of further generating a reconstructed object beam comprising the data signals from the interference pattern of said optical storage medium by associating said first molded optics device with said optical storage medium to direct said reference beam to the optical storage medium.

11. The method of claim 9, further comprising the step of receiving said reconstructed object beam and directing said reconstructed object beam to a detector device, the detector device associated with a second molded optics device comprising a plurality of second reflective surfaces integral to the second molded optics device.

12. The method of claim 9, further comprising the steps of:

forming said first molded optics device of a solid material; and forming said first molded optics device to have a hollow cavity for receiving said reference beam and said object beam.

13. The method of claim 9, further comprising the step of deflecting said reference beam and said object beam to travel through said molded optics storage system along a plurality of parallel paths, said plurality of parallel paths corresponding to different storage locations of said interference patterns in the optical storage medium.

14. The method of claim 9, further comprising the step of placing said data signals on said object beam using a spatial light modulator.

15. The method of claim 9, further comprising the step of angle encoding said reference beam with a predetermined angle, said predetermined angle associated with a particular superimposed data pattern recording in a collection of superimposed recordings in said optical storage medium.

16. The method of claim 9, further comprising the step of phase encoding said reference beam with a predetermined phase pattern, said predetermined phase pattern associated with a particular superimposed data pattern recording in a collection of superimposed recordings in said optical storage medium.

* * * * *